United States Patent
Chen et al.

(10) Patent No.: US 9,748,216 B2
(45) Date of Patent: Aug. 29, 2017

(54) APPARATUS AND METHOD FOR A COMPONENT PACKAGE

(71) Applicant: Taiwan Semiconductor Manufacturing Company, Ltd., Hsin-Chu (TW)

(72) Inventors: Chih-Hua Chen, Zhubei (TW); Chen-Shien Chen, Zhubei (TW); Ching-Wen Hsiao, Hsin-Chu (TW); Ming Hung Tseng, Toufen Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 162 days.

(21) Appl. No.: 14/547,019

(22) Filed: Nov. 18, 2014

(65) Prior Publication Data

US 2015/0069595 A1 Mar. 12, 2015

Related U.S. Application Data

(62) Division of application No. 13/633,615, filed on Oct. 2, 2012, now Pat. No. 8,889,484.

(51) Int. Cl.
*H01L 23/48* (2006.01)
*H01L 25/18* (2006.01)
(Continued)

(52) U.S. Cl.
CPC ............ *H01L 25/18* (2013.01); *H01L 21/561* (2013.01); *H01L 21/6836* (2013.01); *H01L 23/481* (2013.01); *H01L 23/49838* (2013.01); *H01L 24/19* (2013.01); *H01L 24/20* (2013.01); *H01L 24/92* (2013.01); *H01L 24/96* (2013.01);
(Continued)

(58) Field of Classification Search
CPC ................... H01L 23/481; H01L 23/49838
See application file for complete search history.

(56) References Cited

U.S. PATENT DOCUMENTS 7,078,788 B2 * 7/2006 Vu ..................... H01L 21/56
 174/521
7,358,174 B2 4/2008 Mis
(Continued)

FOREIGN PATENT DOCUMENTS

CN 102569214 7/2012
KR 20100062315 6/2010

*Primary Examiner* — Amar Movva
(74) *Attorney, Agent, or Firm* — Slater Matsil, LLP

(57) ABSTRACT

A component package and a method of forming are provided. A first component package may include a first semiconductor device having a pair of interposers attached thereto on opposing sides of the first semiconductor device. Each interposer may include conductive traces formed therein to provide electrical coupling to conductive features formed on the surfaces of the respective interposers. A plurality of through vias may provide for electrically connecting the interposers to one another. A first interposer may provide for electrical connections to a printed circuit board or subsequent semiconductor device. A second interposer may provide for electrical connections to a second semiconductor device and a second component package. The first and second component packages may be combined to form a Package-on-Package ("PoP") structure.

20 Claims, 14 Drawing Sheets

(51) Int. Cl.
    *H01L 25/10*     (2006.01)
    *H01L 23/00*     (2006.01)
    *H01L 21/56*     (2006.01)
    *H01L 21/683*     (2006.01)
    *H01L 23/498*     (2006.01)
    *H01L 25/065*     (2006.01)
    *H01L 23/538*     (2006.01)

(52) U.S. Cl.
CPC .......... *H01L 25/105* (2013.01); *H01L 21/568* (2013.01); *H01L 23/5389* (2013.01); *H01L 24/05* (2013.01); *H01L 24/13* (2013.01); *H01L 24/16* (2013.01); *H01L 24/17* (2013.01); *H01L 24/45* (2013.01); *H01L 24/48* (2013.01); *H01L 24/73* (2013.01); *H01L 24/81* (2013.01); *H01L 24/85* (2013.01); *H01L 25/0657* (2013.01); *H01L 2221/68327* (2013.01); *H01L 2221/68331* (2013.01); *H01L 2221/68368* (2013.01); *H01L 2221/68381* (2013.01); *H01L 2224/0401* (2013.01); *H01L 2224/04105* (2013.01); *H01L 2224/05624* (2013.01); *H01L 2224/05644* (2013.01); *H01L 2224/05647* (2013.01); *H01L 2224/12105* (2013.01); *H01L 2224/13116* (2013.01); *H01L 2224/16145* (2013.01); *H01L 2224/16225* (2013.01); *H01L 2224/17181* (2013.01); *H01L 2224/211* (2013.01); *H01L 2224/215* (2013.01); *H01L 2224/221* (2013.01); *H01L 2224/2518* (2013.01); *H01L 2224/32145* (2013.01); *H01L 2224/32225* (2013.01); *H01L 2224/45124* (2013.01); *H01L 2224/45144* (2013.01); *H01L 2224/45147* (2013.01); *H01L 2224/48091* (2013.01); *H01L 2224/48228* (2013.01); *H01L 2224/48235* (2013.01); *H01L 2224/48624* (2013.01); *H01L 2224/48644* (2013.01); *H01L 2224/48647* (2013.01); *H01L 2224/48724* (2013.01); *H01L 2224/48744* (2013.01); *H01L 2224/48747* (2013.01); *H01L 2224/48824* (2013.01); *H01L 2224/48844* (2013.01); *H01L 2224/48847* (2013.01); *H01L 2224/73265* (2013.01); *H01L 2224/81011* (2013.01); *H01L 2224/81024* (2013.01); *H01L 2224/81203* (2013.01); *H01L 2224/81815* (2013.01); *H01L 2224/82101* (2013.01); *H01L 2224/82106* (2013.01); *H01L 2224/85205* (2013.01); *H01L 2224/92* (2013.01); *H01L 2224/96* (2013.01); *H01L 2225/0651* (2013.01); *H01L 2225/06568* (2013.01); *H01L 2225/1023* (2013.01); *H01L 2225/1035* (2013.01); *H01L 2225/1058* (2013.01); *H01L 2924/01322* (2013.01); *H01L 2924/12042* (2013.01); *H01L 2924/1434* (2013.01); *H01L 2924/15311* (2013.01); *H01L 2924/15787* (2013.01); *H01L 2924/181* (2013.01); *H01L 2924/351* (2013.01)

(56) References Cited

U.S. PATENT DOCUMENTS

| | | |
|---|---|---|
| 7,838,337 B2 | 11/2010 | Marimuthu et al. |
| 2007/0141758 A1 | 6/2007 | Tanaka |
| 2011/0159639 A1 | 6/2011 | Yee et al. |
| 2011/0316156 A1 | 12/2011 | Pagaila et al. |
| 2012/0161315 A1 | 6/2012 | Lin et al. |

\* cited by examiner

APPARATUS AND METHOD FOR A COMPONENT PACKAGE

PRIORITY CLAIM

This application is a divisional of U.S. patent application Ser. No. 13/633,615, filed Oct. 2, 2012, and entitled "Apparatus and Method for a Component Package," now U.S. Pat. No. 8,889,484, which application is incorporated herein by reference.

BACKGROUND

Improvements in the size, formation, density, and packaging of integrated circuits ("ICs") have led the semiconductor industry to experience rapid growth. Improvements in integration density have led to decreased IC feature size, which allows more components to be integrated into a given area.

One improvement to increase circuit density is to stack two IC dies on top of each other to form what is referred to as a three-dimensional ("3D") IC. In a typical 3D IC formation process, two dies are bonded together and electrical connections are formed between each die and contact pads on a substrate. For example, two dies are bonded on top of each other with the lower die being coupled to a substrate. Through vias ("TVs") in the substrate connect the dies to conductive pads on an opposing surface of the substrate. The conductive pads can then be electrically coupled to a printed circuit board ("PCB") or the like using electrical connections.

Another 3D package which increases circuit density is referred to as a "Package-on-Package" ("PoP") structure, wherein multiple dies coupled to respective substrates can be "stacked" on top of each other and coupled together. To form a PoP structure, a first die is electrically coupled to a first substrate to form a first circuit. The first circuit includes first connection points for connecting to a second circuit. The second circuit includes a second die and substrate having connection points on each side of the substrate. The first circuit is stacked and electrically coupled on top of the second circuit to form the PoP structure. The PoP structure can then be electrically coupled to a PCB or the like using electrical connections.

Memory circuits are stacked in 3D ICs with various other circuit components to form memory modules. Such memory modules can often include logic circuits, one or more processors, or one or more application processor units ("APUs"), which might be developed as user defined application specific integrated circuits ("ASICs"). Memory modules disposed in 3D ICs typically include an APU coupled to a substrate with TVs connecting the APU to solder pads on an opposing surface of the substrate. The TVs increase the overall height of a 3D IC as well as the design and manufacturing complexity of the 3D IC. The TVs also lower throughput for a memory circuit.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Figure 1:
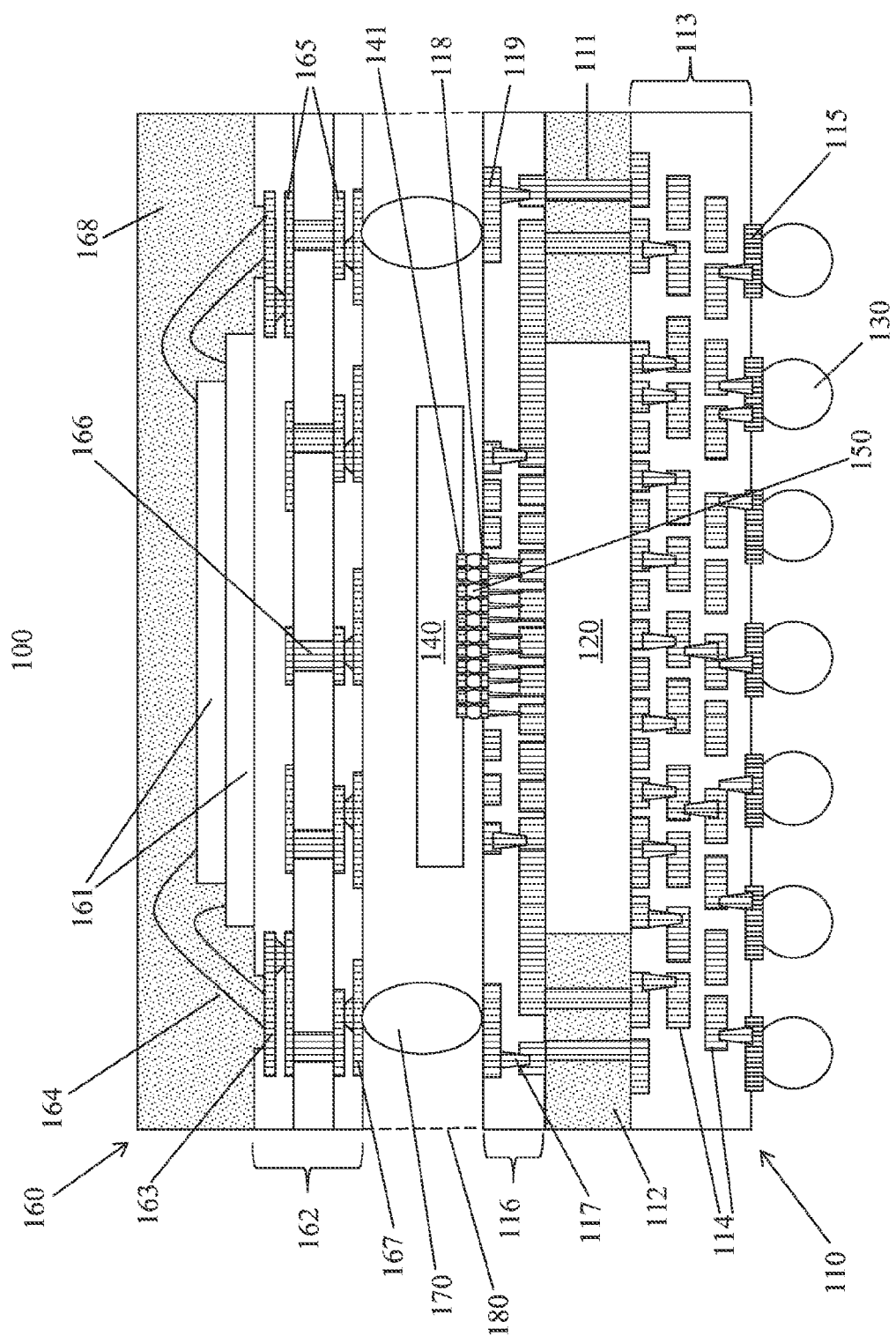
FIG. 1 illustrates a cross sectional view of a structure for use in illustrating the embodiments.

Referring first to FIG. 1, there is illustrated an example PoP structure 100 used to illustrate an application of the embodiments. The PoP structure 100 may include a first component package 110 and a second component package 160. The first component package 110 and the second component package 160 may be electrically coupled together to form the PoP structure 100, as will be discussed in more detail herein.

The first component package 110 may include a first die 120. The first die 120 may have a first side and a second side. The first-side is also referred to herein as the "front-side" while the second-side is also referred to herein as the "back-side." The first die 120 front-side may be electrically coupled to a first redistribution layer ("RDL") 113 as described in more detail below. A second RDL 116 may be formed on the first die 120 back-side. A second die 140 may be electrically coupled to the second RDL 116 as described in more detail below. The first and second RDLs 113, 116 may be electrically coupled together using a first set of TVs 111, such as through assembly vias, which may be positioned in a first encapsulating material 112 surrounding the first die 120.

The first RDL 113 may include one or more dielectric layers having first metallization traces 114 formed therein. The first traces 114 may be formed of copper, aluminum, gold or other like materials to provide conductive paths through the first RDL 113. The first RDL 113 may be formed using one or more subtractive etch processes, single Damascene techniques, and/or dual-Damascene techniques. The first RDL 113 may have formed thereon a first set of conductive features 115, which may also be coupled to the first traces 114. The first set of conductive features 115 may be formed of copper, aluminum, gold or other like materials. The first set of conductive features 115 may have formed thereon a first set of conductive connections 130, which may provide for electrical connection of the PoP structure 100 to a PCB, a high density interconnect, a substrate, a silicon substrate, an organic substrate, a ceramic substrate, a laminate substrate, another semiconductor package, or the like. In various embodiments, the first set of conductive connections 130 may comprise lead free solder, eutectic lead, conductive pillars, combinations thereof, and/or the like.

The first RDL 113 as well as the corresponding first traces 114 and first set of conductive features 115 may provide signal remapping and additional support to the first die 120. The first RDL 113 may also provide thermal stress relief between the first die 120 and a PCB or other electronic device upon which the PoP structure 100 may be mounted. In an embodiment, a molding under fill ("MUF") (not shown) may be applied between the first set of conductive features 115 to protect the area between the features from the environment or external contaminants. In an embodiment, a first passivation layer (not shown) may be formed between the first die 120 and the first RDL 113. The first passivation layer may be a polyimide layer, PBO, BCB, a non-photosensitive polymer, and in alternative embodiments, may be formed of nitride, carbide or other dielectric.

As illustrated in FIG. 1, the first RDL 113 may be free from TVs, which may decrease the overall height of the first package 110 as well as decrease the design and manufacturing complexity of the first component package 110. As an additional benefit, the absence of TVs in the first RDL 113 may increase the manufacturing yield for the PoP structure 100 over a design that includes TVs in a similarly situated interposer.

The second RDL 116 may include one or more dielectric layers having second metallization traces 117 formed therein. The second traces 117 may be formed of copper, aluminum, gold or other like materials to provide conductive paths through the second RDL 116. The second RDL 116 may be formed using one or more subtractive etch processes, single Damascene techniques, and/or dual-Damascene techniques. The second RDL 116 may have formed thereon a second set of conductive features 118 and third set of conductive features 119, each of which may also be coupled to the second traces 117. The second die 140 may have formed thereon a fourth set of conductive features 141. The second, third, and/or fourth sets of conductive features 118, 119, 141, respectively, may be formed of copper, aluminum, gold or other like materials. The second die 140 may be coupled to the second RDL 116 via a second set of conductive connections 150, which may be coupled to the second set of conductive features 118 formed on the second RDL 116 and the fourth set of conductive features 141 of the second die 140. In an embodiment, a passivation layer (not shown) may be formed between the first die 120 and the second RDL 116.

The second die 140 may be electrically coupled to the first die 120 via conductive channels formed by the fourth set of conductive features 141, the second set of conductive connections 150, the second set of conductive features 118, the second traces 117, the first set of TVs 111, the first traces 114 and the conductive features (not shown) formed on the first die 120 front-side. The second traces 117, the first set of TVs 111, the first traces 114, the first set of conductive features 115, and the first set of conductive connections 130 may also provide electrical connectivity between the second die 140 and a PCB or interposer to which the PoP structure 100 may be mounted.

In an embodiment, the first die 120 may be an APU. In an embodiment, the second die 140 may be a memory IC, for example a dynamic RAM such as a wide data word ("wide I/O") DRAM or DDR RAM. In another embodiment, the second die 140 may be a static RAM such as an SRAM, or a non-volatile device such as EPROM or FLASH memory.

As discussed, the TVs 111 do not need to be routed through the first die. In some embodiments where the first die 120 may be an APU and the second die may be a memory IC, eliminating TV routing through the first die 120 may support higher I/O bandwidth memory ICs than packages which include TV routing through a such a die. Another advantage that may be realized by eliminating TV routing through the first die 120 is increased flexibility to adapt the first component package 110 to support different die types— for both the first die 120 and the second die 140—built according to different manufacturing processes (i.e., 45 nm, 65 nm, etc.) or made of different semiconductor materials (i.e., GaAs) without costly redesign of the first component package 110. This increased flexibility may reduce manufacturing and testing costs (i.e., TV signal integrity characterizations) as well as decrease time to market for technology redesigns as compared to technologies that utilize TVs through the first die 120. Moreover, eliminating TV routing through the first die 120 may increase manufacturing yield for the first component package 110.

In various embodiments, the first set of TVs 111 may be formed of copper, aluminum, gold or the like. In various embodiments, the second die 140 may be coupled to the second RDL 116 using an under bump metallization structure, a micro under bump metallization structure, metal pillars, metal pillar bumps, or the like. In various embodiments the second set of conductive connections 150 may comprise lead free solder, eutectic lead or the like. In various embodiments, the first encapsulating material 112 may comprise, for example, resins, epoxies, polymers or the like and may protect the components in the first component package 110 from the environment or contaminants. In an embodiment, the first component package 110 may include an encapsulant or under fill (not shown) positioned between the first set of conductive features 115 and the first set of conductive connections 130.

As noted above, the PoP structure 100 may include a second component package 160. The second component package 160 may include one or more third die(s) 161 electrically coupled to an interposer 162. The second component package 160 may be electrically coupled to the first component package 110 as described in further detail herein. The interposer 162 may be a ceramic, plastic, laminate, film, dielectric or other like layer and may include third metallization traces or RDLs 165. The interposer 162 may also be a PCB, a substrate, a silicon substrate, an organic substrate, a ceramic substrate, a laminate substrate, another semiconductor package, or the like. The third traces 165 may be formed of copper, aluminum, gold or other like materials to provide conductive paths through the interposer 162. The interposer 162 may also include TVs 166, which may be formed of copper, aluminum, nickel, or other like material.

On a first side, the interposer 162 may have formed thereon a fifth set of conductive features 163, which may also be electrically coupled to the third traces 165. On an opposing second side, the interposer 162 may have formed thereon a sixth set of conductive features 167, which may also be electrically coupled to the third traces 165. The fifth and sixth sets of conductive features may be formed of copper, aluminum, gold or other like materials. The one or more third die(s) 161 may be coupled to the fifth set of conductive features 163 via a third set of conductive connections 164. The third set of conductive connections 164 may comprise, for example, capillary wire bonds, which may be formed of aluminum, copper, gold, or other wire bonding materials. In an embodiment, the third set of conductive connections 164 may, for example, be coupled to the fifth set of conductive features 163 using a thermocompression bond ("TCB").

FIG. 1 illustrates that electrical connections formed between the third die(s) 161 (i.e., via the third set of conductive connections 164) using wire bonding techniques for illustrative purposes only. Other embodiments may utilize other methods, such as flip-chip, ball grid arrays, TVs, under bump metallization, conductive pillars, and the like.

The second component package 160 may further include a second encapsulating material 168 that may be formed over the components to protect the components from the environment and/or external contaminants. In various embodiments, the second encapsulating material 168 may comprise, for example, resins, epoxies, polymers or the like. The second component package 160 may be coupled to the first component package 110 via a fourth set of conductive connections 170 coupled between the third set of conductive features 119 and the sixth set of conductive features 167. The fourth set of conductive connections 170 may comprise, for example, lead free solder, eutectic lead, conductive pillars, combinations thereof, and/or the like. In an embodiment, a flux (not shown) may be applied to the surface of either or both of the third and sixth sets of conductive features 119 and 167, respectively. The flux may be applied, for example, during an operation in which the surface of either the second RDL 116 or the interposer 162, respectively, may be dipped in or coated in the flux. The flux may help clean the surface of the conductive features of an interposer, thereby aiding in the formation of the electrical contact between each conductive feature of the third and sixth sets of conductive features, 119 and 167, respectively. In another embodiment a MUF 180 may be positioned between the first and second component packages 110, 160 to protect the area between the second RDL 116 and the interposer 162 from the environment or external contaminants.

In an embodiment, the third die(s) 161 may be a dynamic RAMs such as a wide data word DRAM, DDR RAM, or low power DDR ("LPDDR") RAM. In another embodiment, the third die(s) 161 may be a static RAM such as an SRAM, or a non-volatile device such as EPROM or FLASH memory.

Figure 2:
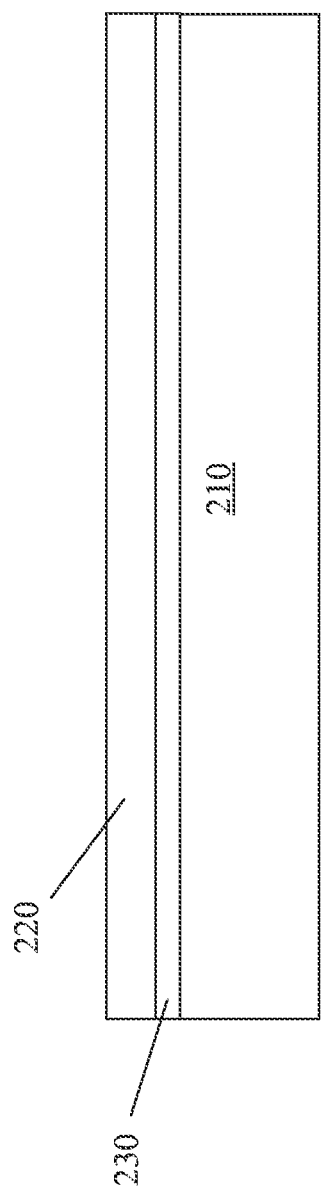
FIGS. 2-16 illustrate various intermediate stages of forming an embodiment.

FIGS. 2-16 are cross-sectional views of intermediate stages in forming an embodiment. FIG. 2 illustrates a cross-sectional view of placing a first metal layer 220 on a first carrier 210 to begin formation of the first package 110 according to an embodiment of the present disclosure. The first carrier 210 may be formed of various materials, including but not limited to, glass, silicon, ceramics, combinations thereof and/or the like. As illustrated in FIG. 2, the first metal layer 220 may be temporarily mounted on or attached to the first carrier 210 using a first adhesive layer 230. The thickness of the first metal layer 220 and the first adhesive layer 230 as shown in FIG. 2 are exaggerated for illustrative purposes only.

In various embodiments, the first metal layer 220 may be formed by a conductive material such as, for example, copper foil, copper alloys, aluminum, tungsten, silver, combinations thereof and/or the like. In various embodiments, the first adhesive layer 230 may be formed, for example, of an epoxy or the like.

In an embodiment, the first metal layer 220 may be formed through an electrochemical or plating process. For such a process, a first photoresist mask (not shown) may be formed on the first adhesive layer 230 or the first carrier 210 (in an embodiment without the first adhesive layer 230). The first mask may be etched to provide areas for the first metal layer 220, which may then be formed thereon using, for example, electroplating techniques.

Figure 3:
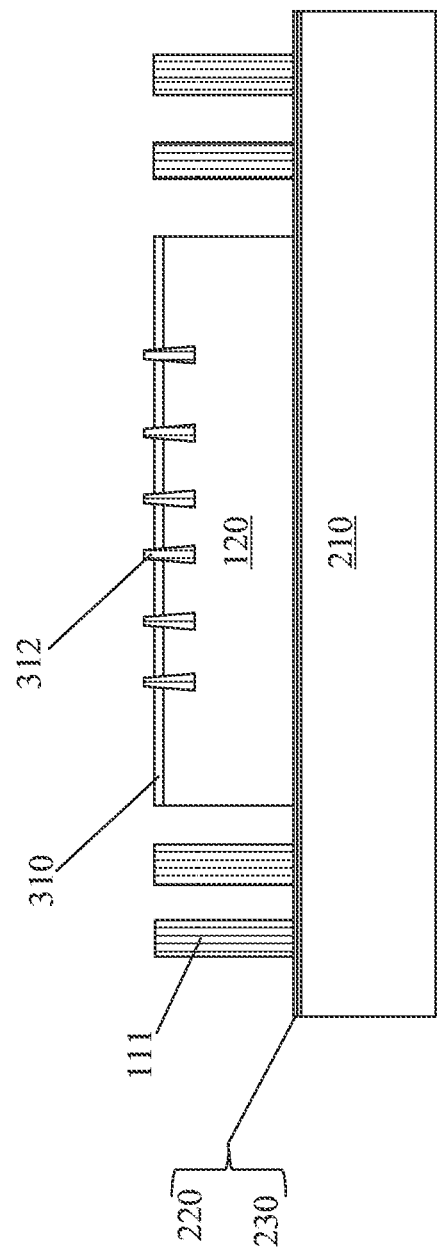

FIG. 3 illustrates a cross-sectional view of forming the first set of TVs 111 on the first metal layer 220. The first metal layer 220 may act as a seed layer for first set of TVs 111, which may be formed therefrom. In an embodiment, the TVs 111 may be formed through an electrochemical deposition or plating process. For such a process, a second photoresist mask (not shown) may be formed on the first metal layer 220. The second mask may be etched to provide openings for positioning the TVs 111 on the first metal layer 220. The TVs 111 may then be formed on the first metal layer 220, using, for example, electroplating techniques, and the mask may be subsequently removed. Following formation of the TVs 111, the first die 120 back-side may be mounted on or attached to the first metal layer 220. On the first die 120 front-side there may be formed a first passivation layer 310 and a seventh set of conductive features 312, which may provide for electrical connection to the first die 120.

In various embodiments, the first set of TVs 111 may be formed of copper, aluminum, tungsten, gold, combinations thereof, and/or the like. In various embodiments, the first passivation layer 310 may be a polyimide layer, PBO, BCB, a non-photosensitive polymer, and in alternative embodiments, may be formed of nitride, carbide or other dielectric. The TVs 111 as shown in FIG. 3 may also be referred to as conductive pillars. Upon formation of an encapsulating material around the conductive pillars (as discussed below for FIG. 4), the pillars may be referred to as TVs 111.

Figure 4:
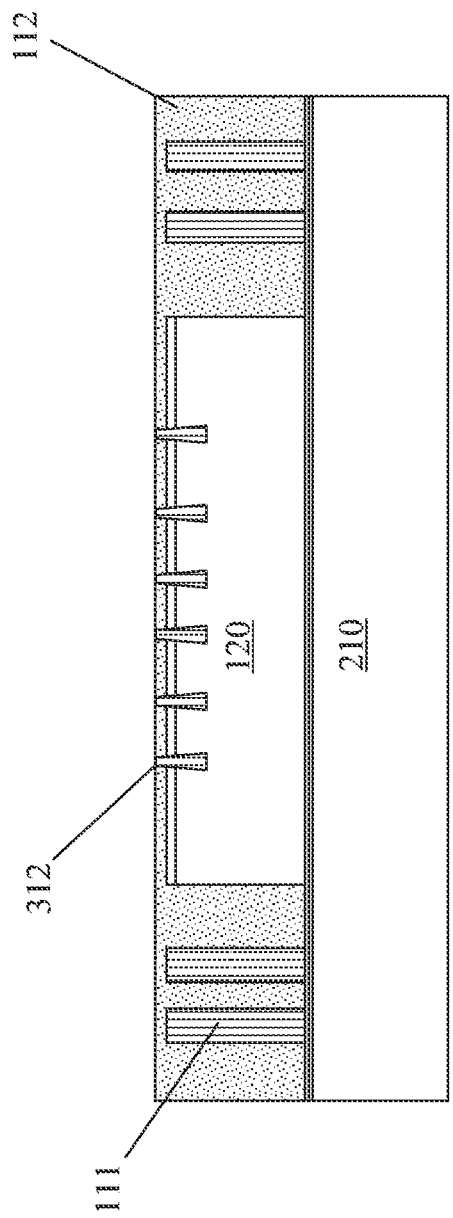
Figure 5:
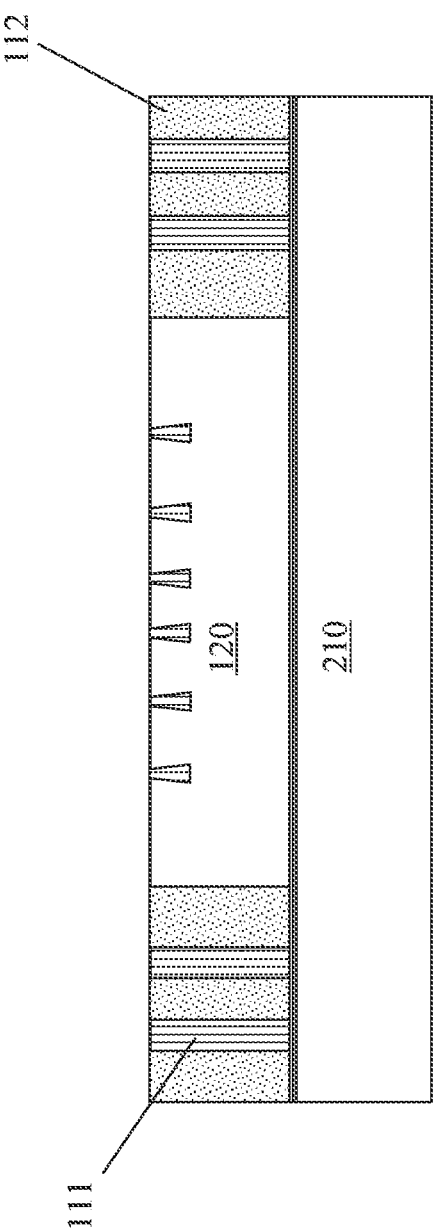

As illustrated in FIG. 4, the first encapsulating material 112 may be formed upon the components in the first package including, but not limited to, the first die 120 and the first set of TVs 111. The first encapsulating material 112 may be formed upon the components using an injection, molding or other like process. In an embodiment, the first encapsulating material 112 may cover the first die 120 front-side surface to a predetermined height. In various embodiments, the first encapsulating material 112 may comprise, for example, resins, epoxies, polymers or the like and may protect the components in the first component package 110 from the environment or contaminants. Referring now to FIG. 5, the first encapsulating material 112 may be removed from the front-side surface of the first die 120 through grinding, lapping, or other similar process to expose the top surface of the first die 120 and the seventh set of conductive features 312.

Figure 6:
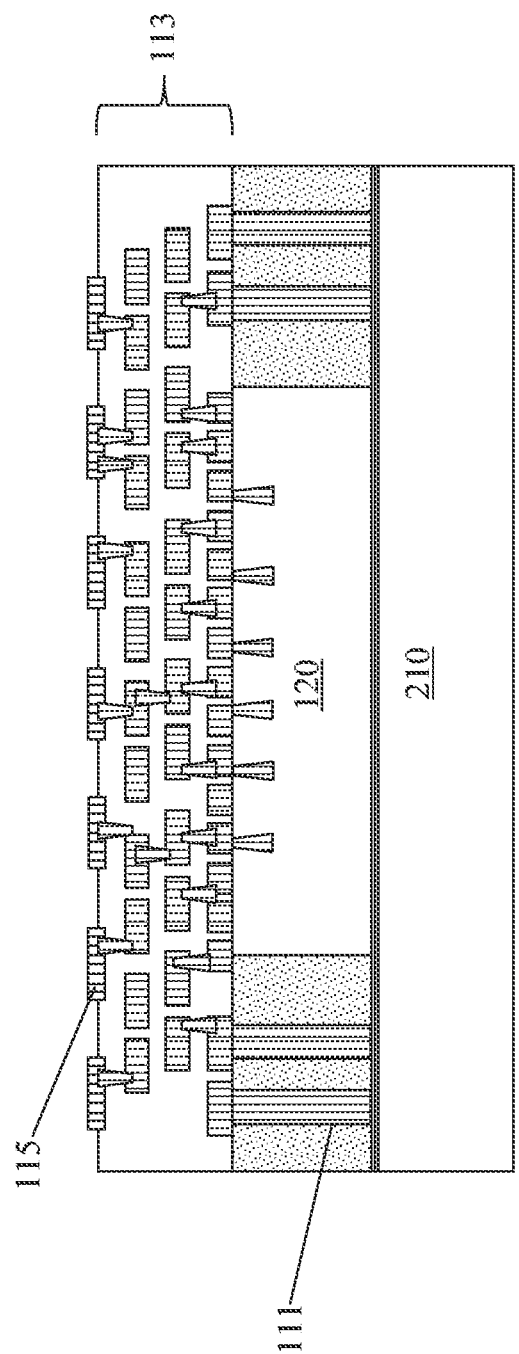

FIG. 6 illustrates formation of the first RDL 113 on the first die 120 front-side. The first RDL 113 may be formed using one or more subtractive etch processes, single Damascene techniques, and/or dual-Damascene techniques. As discussed, the first RDL 113 may include first metallization traces 114 and may have formed thereon the first set of conductive features 115. In accordance with an embodiment of the present disclosure the first RDL 113 may be formed to a height of approximately 60 μm, although the height may be varied as determined by various design factors including, but not limited to, routing requirements of the first traces 114 through the first RDL 113.

Figure 7:
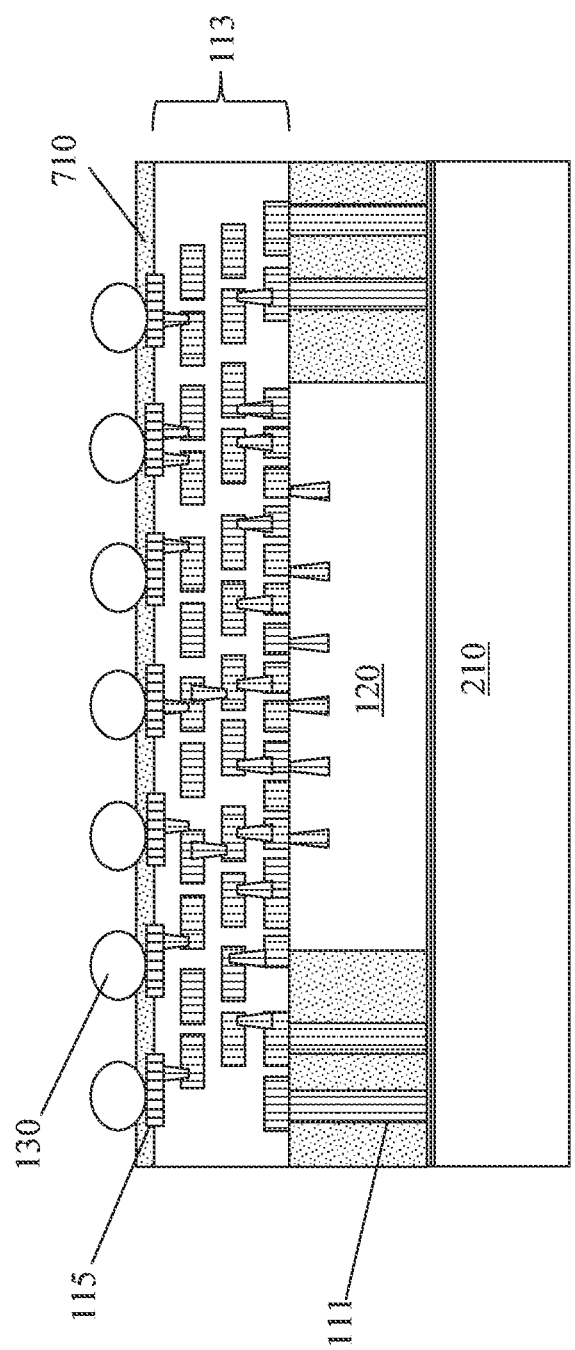

As illustrated in FIG. 7, the first set of conductive features 115 may have formed thereon the first set of conductive connections 130. In various embodiments, the first set of conductive connections 130 may comprise lead free solder, eutectic lead, conductive pillars, combinations thereof, and/or the like. In an embodiment, a MUF 710 may be positioned between the first set of conductive features 115 and/or the first set of conductive connections 130 to protect the first RDL 113 from the environment or external contaminants. The MUF 710 may be formed, for example, of a polymer, epoxy or other like material.

Figure 8:
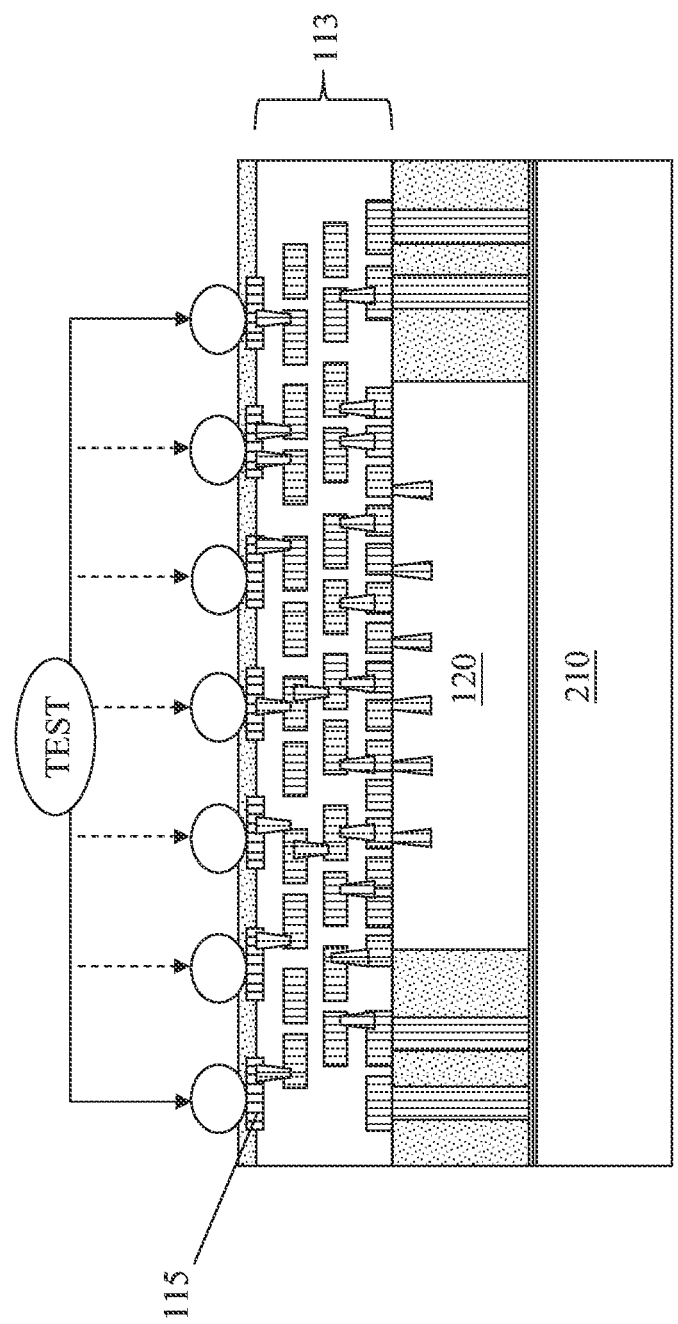

Referring now to FIG. 8, a first functional test may be performed on the first die 120 via the first set of conductive connections 130. The functional test may be performed to verify connectivity to the first die 120 through the first RDL 113 via the first traces 114. The functional test may also be performed to verify certain functionality of the first die 120.

Figure 9:
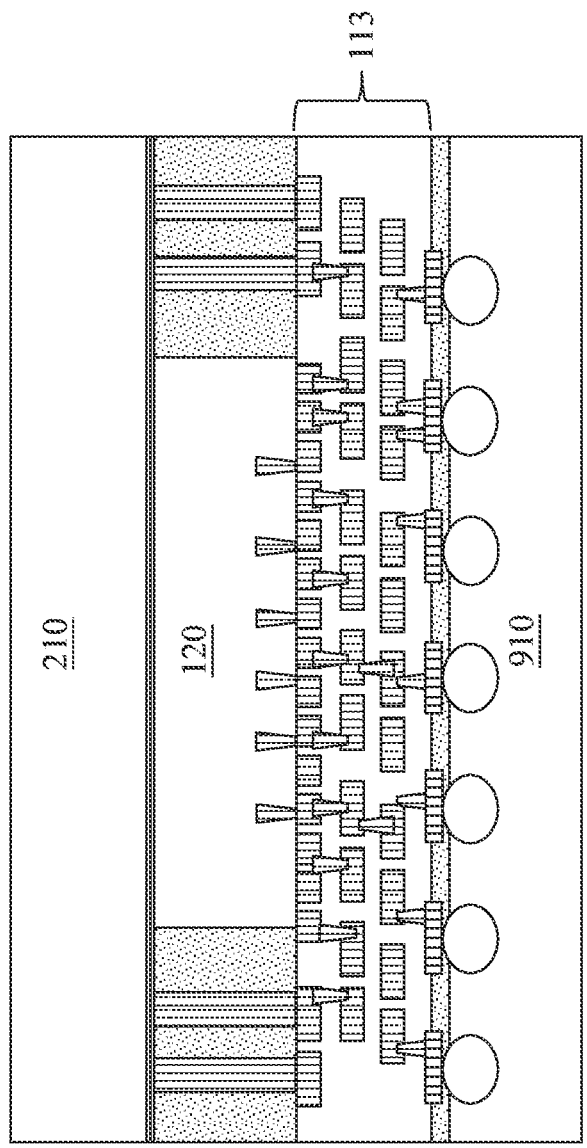
Figure 10:
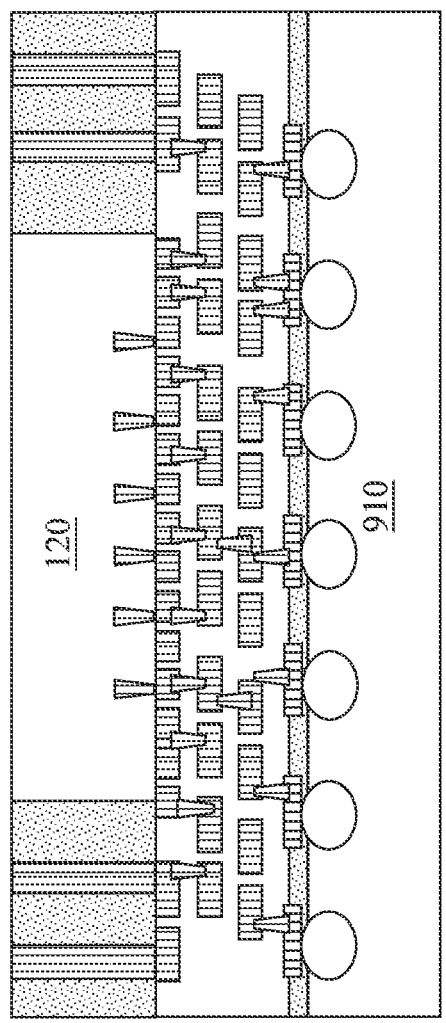

As illustrated in FIG. 9, a second carrier 910 may be affixed or bonded on a side opposite the first carrier 210. The second carrier 910 may be formed of various materials, including but not limited to, glass, silicon, ceramics, combinations thereof and/or the like. Referring now to FIG. 10, the first carrier 210 may be removed or de-bonded from the back-side area of the first die 120. A lapping or grinding process may be performed to remove the first metal layer 220 and the first adhesive layer 230 (as illustrated in FIG. 2) from the back-side area.

Figure 11:
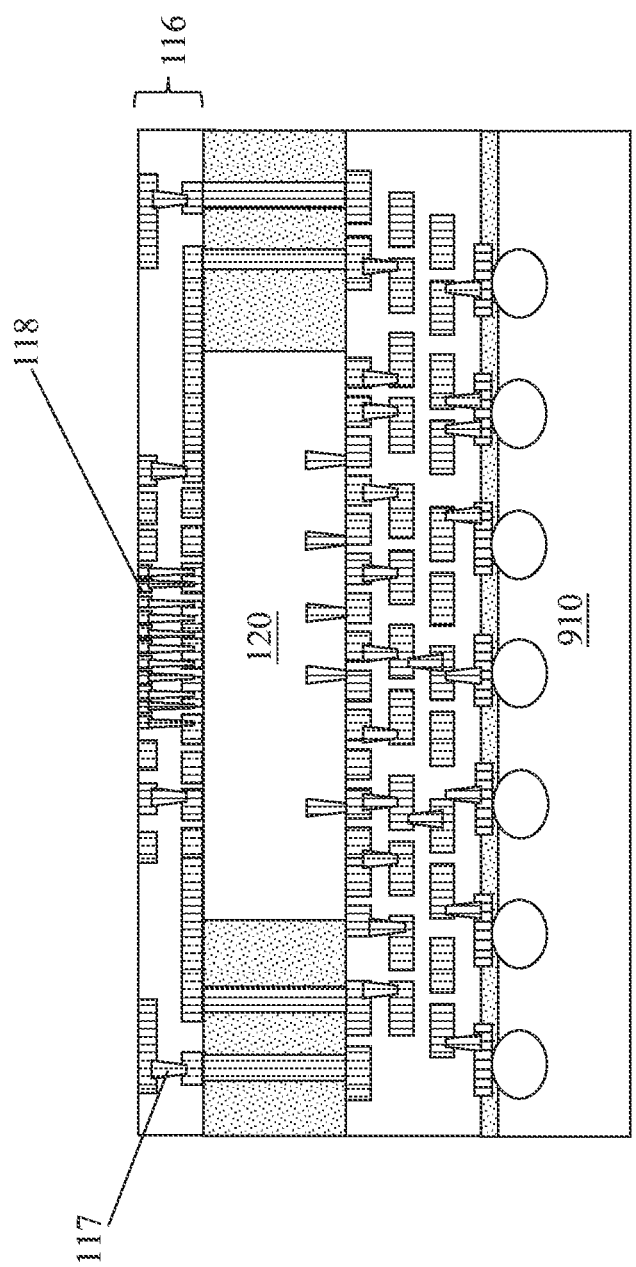

FIG. 11 illustrates formation of the second RDL 116 on the first die 120 back-side. The second RDL 116 may be formed using one or more subtractive etch processes, single Damascene techniques, and/or dual-Damascene techniques. As discussed previously, the second RDL 116 may have formed thereon second and third sets of conductive features 118 and 119 each of which may also be coupled to the second traces 117.

Figure 12:
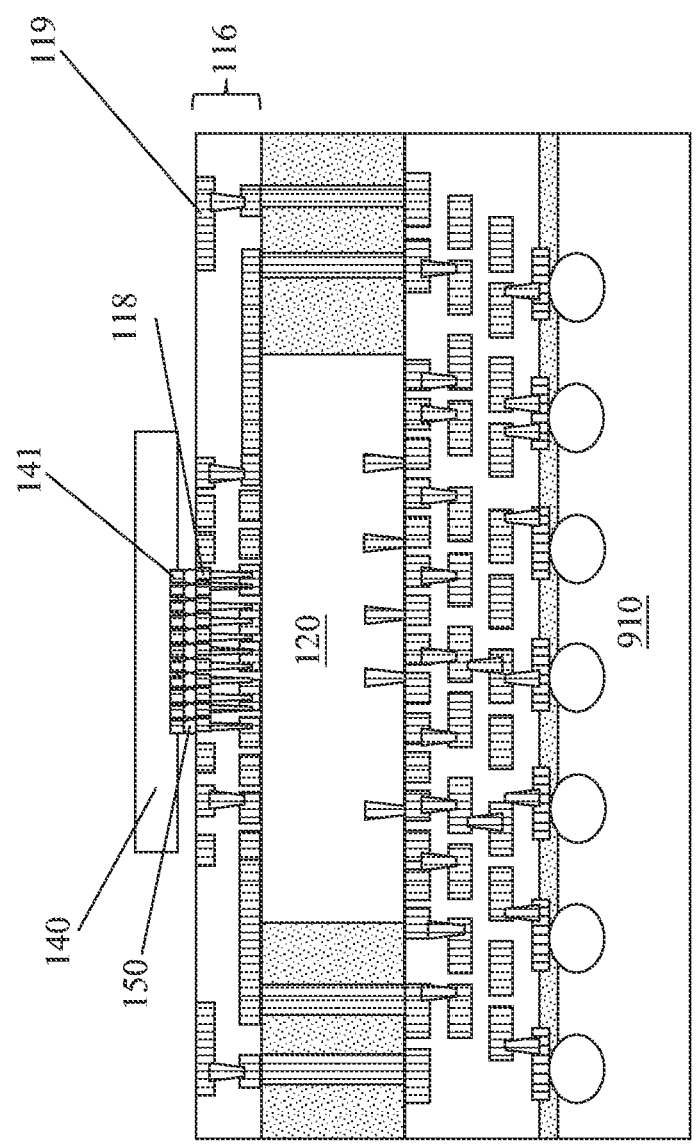

As illustrated in FIG. 12, the second die 140 may be electrically coupled to the second RDL 116. The second set of conductive connections 150 may be formed between the fourth set of conductive features 141 of the second die 140 and the second set of conductive features 118 of the second RDL 116. In various embodiments, the second die 140 may be coupled to the second RDL 116 using an under bump metallization structure, a micro under bump metallization structure, metal pillars or the like. In various embodiments, the second set of conductive connections 150 may comprise lead free solder, eutectic lead or the like, wherein the second die 140 may be coupled to the second RDL 116 using a reflow process. In another embodiment the second die 140 may be coupled to the second RDL 116 using a thermal compression process. In an embodiment a MUF (not shown) may be positioned between the second die 140 and the second RDL 116. In accordance with an embodiment of the present disclosure the height from the first die 120 front-side to the sets of conductive features of the second RDL 116 may be approximately 90 µm, which may provide a package height improvement over memory packages that employ TVs for electrically coupling a second die to a first die.

Figure 13:
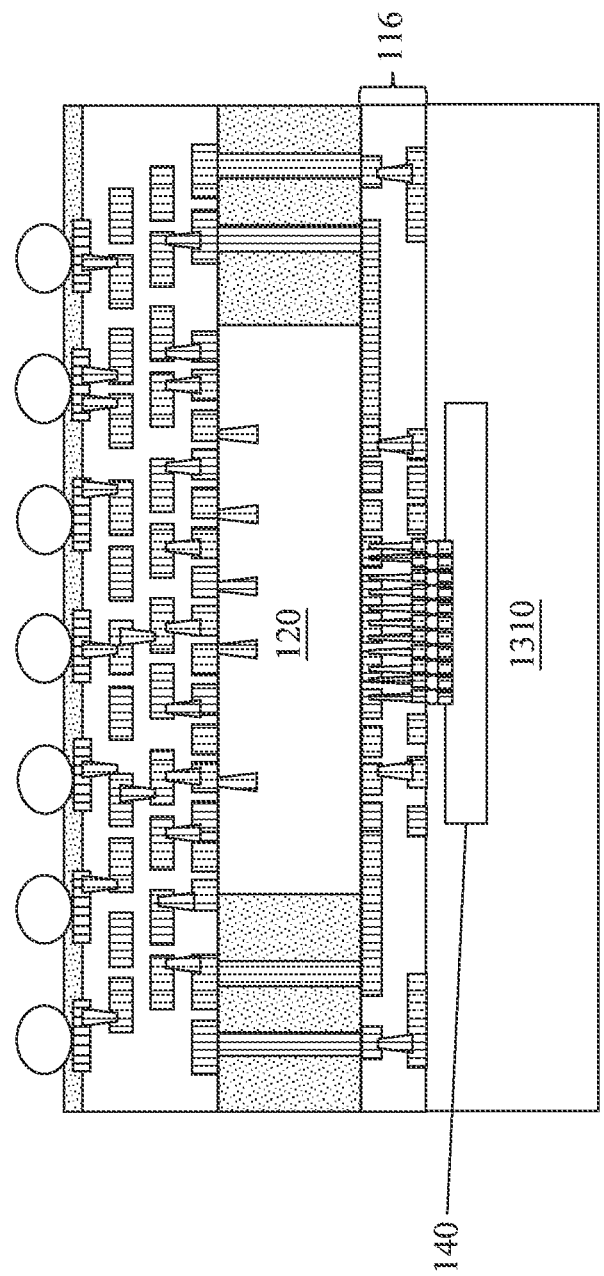
Figure 14:
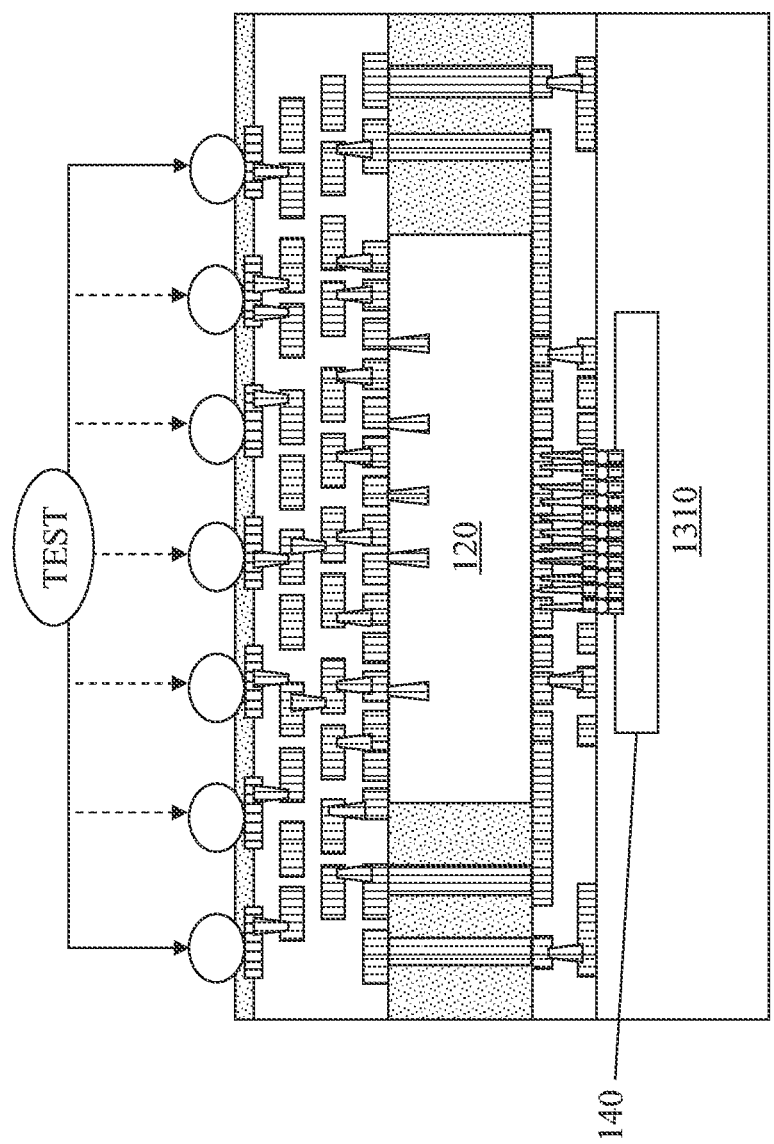

As shown in FIG. 13, the first component package 110 may be affixed to a dicing tape 1310 and the second carrier 910 may be de-bonded or removed. As illustrated in FIG. 14, a second functional test may be performed on the first package to verify connectivity through the conductive path to the second die 140 formed via the first set of conductive connections 130, the first and second RDLs 113, 116 (and corresponding traces), the second and fourth conductive features 118, 141 and the second set of conductive connections 150. The second functional test may also be performed to verify functionality of the second die 140.

Figure 15:
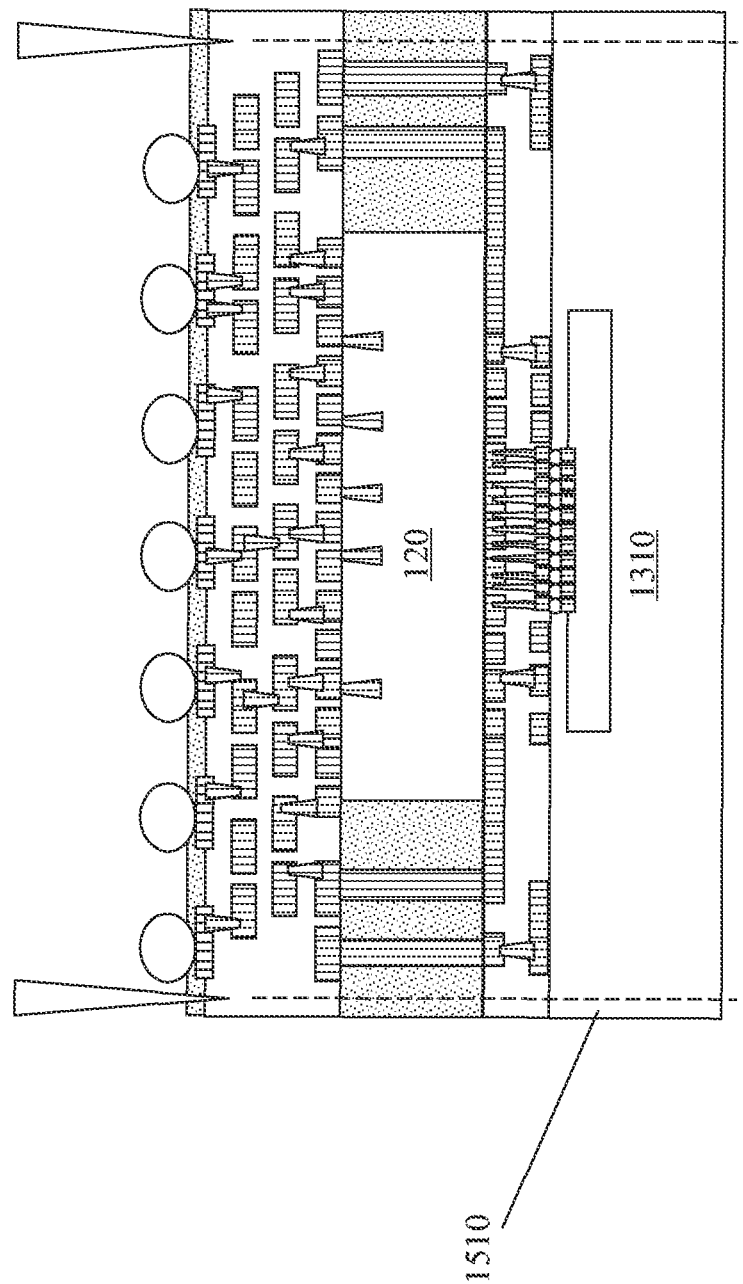

In FIG. 15, singulation may be performed along scribe lines 1510 to form the first component package 110 as shown in FIG. 1. The singulation may be performed through a cutting or singulation process wherein a mechanical or laser saw may be used to separate multiple instances of the first component package 110 from each other. The first component package 110 may be removed from the dicing tape 1310 following singulation.

Figure 16:
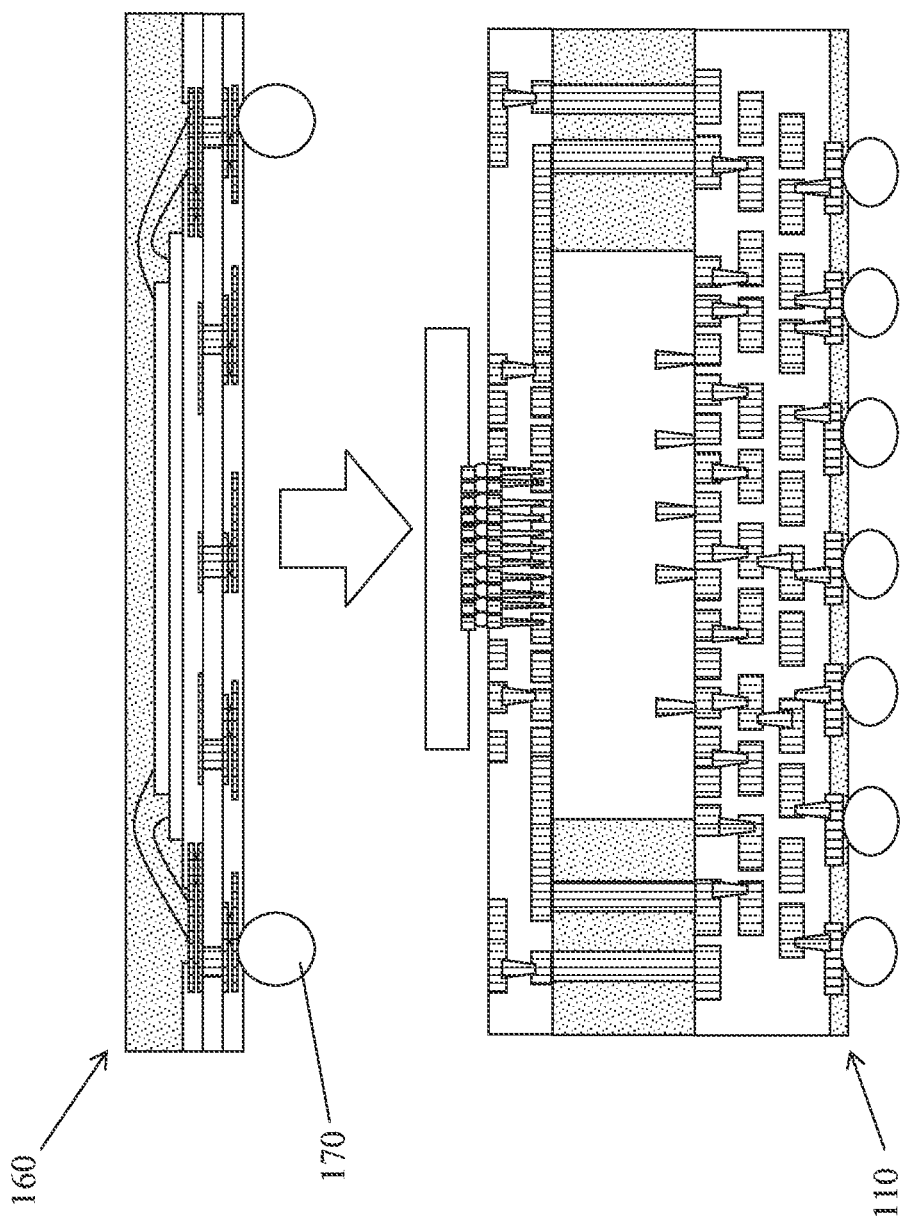

Referring now to FIG. 16, the second component package 160 may be coupled to the first package 110 to form the PoP structure 100, as shown in FIG. 1. The coupling may be performed via the fourth set of conductive connections 170 that may be electrically connected between the third set of conductive features 119 and the sixth set of conductive features 167. A reflow process may be used to form the electrical connections coupling the second component package 160 to the first component package 110. The second component package 160 may be formed using similar processes and techniques as described for the components and formation of the first component package 110.

In an embodiment, an apparatus is provided. The apparatus comprises a first semiconductor device, a second semiconductor device, a first RDL electrically coupled to a first side of the first semiconductor device, a second RDL positioned on a second side of the first semiconductor device, the second RDL electrically coupled to the second semiconductor device, a first material positioned between the first RDL and the second RDL, and a plurality of through vias extending through the first material, the through vias to electrically couple the first RDL to the second RDL.

In another embodiment, another apparatus is provided. The apparatus comprises a first and a second packaging component. The first packaging component comprises a first semiconductor device having a first and second side, a first RDL electrically coupled to the first side of the first semiconductor device, a second RDL positioned on the second side of the first semiconductor device, the second RDL electrically coupled to a second semiconductor device, the second RDL having a plurality of first conductive features formed thereon, a first material positioned between the first RDL and the second RDL, a plurality of through vias extending through the first material, the through vias to electrically couple the first RDL to the second RDL. The second packaging component comprises a third semiconductor device, and an interposer electrically coupled to the third semiconductor device, the interposer having a plurality of second conductive features formed thereon, wherein the second conductive features are electrically coupled to the first conductive features of the second RDL.

In another embodiment, a method is provided. The method comprises forming a first metal layer on a first carrier, forming a plurality of conductive pillars on the first metal layer, attaching a first side of a first semiconductor device to the first metal layer, encapsulating the first semiconductor device and the plurality of conductive pillars, forming a first RDL on a second side of the first semiconductor device, wherein the first RDL is electrically coupled to the conductive pillars and the first semiconductor device, attaching a second carrier to the first RDL, removing the first carrier and the first metal layer, and forming a second RDL on the first side of the first semiconductor device to form a first packaging component, the second RDL electrically coupled to the plurality of conductive pillars.

It should be understood that the above description provides a general description of embodiments and that embodiments may include numerous other features. For example, embodiments may include under bump metallization layers, passivation layers, molding compounds, additional dies and/or substrates, and the like. Additionally, the structure, placement, and positioning of the first, second, and third dies, 120, 140 and 161, respectively, are provided for illustrative purposes only, and accordingly, other embodiments may utilize different structures, placements, and positions.

Although the present embodiments and their advantages have been described in detail, it should be understood that various changes, substitutions and alterations can be made herein without departing from the spirit and scope of the disclosure as defined by the appended claims. For example, it will be readily understood by those skilled in the art that the structures and ordering of steps as described above may be varied while remaining within the scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus, comprising:
    a first semiconductor device having first conductive features formed on a first side thereof;
    a second semiconductor device having second conductive features formed on a first side thereof;
    a first redistribution layer (RDL) comprising one or more first dielectric layers and a first conductive structure, the first conductive structure electrically coupled to the first side of the first semiconductor device;
    a second RDL comprising one or more second dielectric layers and a second conductive structure, the second RDL positioned on a second side of the first semiconductor device opposing the first side of the first semiconductor device, the second conductive structure of the second RDL electrically coupled to the second conductive features of the second semiconductor device, the second RDL disposed between the first semiconductor device and the second semiconductor device;
    a first material positioned between the first RDL and the second RDL, the first material extending from the first RDL to the second RDL, wherein an upper surface of the first material distal the first RDL is substantially level with an upper surface of the first semiconductor device distal the first RDL; and
    a plurality of through vias extending through the first material, the through vias electrically coupled to the first conductive structure of the first RDL and the second conductive structure of the second RDL.

2. The apparatus of claim 1, wherein the plurality of through vias extend through the first material in one or more areas adjacent to the first semiconductor device.

3. The apparatus of claim 1, wherein the through vias are made of a material selected from the group consisting of copper, aluminum, gold, tungsten and combinations thereof.

4. The apparatus of claim 1, wherein the first semiconductor device is an application processor unit.

5. The apparatus of claim 1, wherein the second semiconductor device is a memory IC die.

6. The apparatus of claim 1, wherein the first RDL is free of through vias extending therethrough.

7. The apparatus of claim 1, wherein the first semiconductor device includes a substrate and the substrate is free of through vias extending therethrough.

8. An apparatus, comprising:
    a first packaging component, the first packaging component comprising:
        a first semiconductor device having a first side and a second side opposing the first side;
        a first redistribution layer (RDL) electrically coupled to the first side of the first semiconductor device;
        a second RDL positioned on the second side of the first semiconductor device, the second RDL electrically coupled to a second semiconductor device, the second RDL having a plurality of first conductive features on a first surface of the second RDL distal the first semiconductor device, the second RDL being disposed between the first semiconductor device and the second semiconductor device, the second semiconductor device being attached to the plurality of first conductive features;
        a first material positioned between the first RDL and the second RDL; and
        a plurality of through vias extending through the first material, the through vias electrically coupled to the first RDL and the second RDL; and
    a second packaging component, the second packaging component comprising:
        a third semiconductor device over the second semiconductor device, wherein the second semiconductor device is between the third semiconductor device and the second RDL; and
        an interposer electrically coupled to the third semiconductor device, the interposer having a plurality of second conductive features formed thereon, wherein the second conductive features are electrically coupled to the plurality of first conductive features of the second RDL.

9. The apparatus of claim 8, wherein the first semiconductor device is an application processor unit.

10. The apparatus of claim 8, wherein the second semiconductor device is a memory IC die.

11. The apparatus of claim 8, wherein the third semiconductor device is a memory IC die.

12. The apparatus of claim 8, wherein the first RDL is free of through vias extending therethrough.

13. The apparatus of claim 8, further comprising connectors coupled between the second RDL of the first packaging component and the interposer of the second packaging component, wherein the second semiconductor device is disposed between the connectors.

14. The apparatus of claim 13, wherein an upper surface of the second semiconductor device distal the second RDL is spaced apart from a lower surface of the interposer facing the second RDL.

15. An apparatus comprising:
    a first semiconductor die having first conductive features formed on a front side thereof;
    a first redistribution layer (RDL) on the front side of the first semiconductor die, wherein a conductive structure of the first RDL is coupled to the first conductive features of the first semiconductor die;
    a second RDL on a back side of the first semiconductor die, the second RDL having second conductive features formed on a first surface of the second RDL distal the first semiconductor die;
    a through via laterally displaced from the first semiconductor die and having a first end in contact with the first RDL and a second end in contact with the second RDL;
    an encapsulant surrounding the first semiconductor die and the through via, wherein the second RDL extends over a top surface of the first semiconductor die and a top surface of the encapsulant, wherein the encapsulant fills a space between the first RDL and the second RDL;
    a second semiconductor die having third conductive features formed on a front side of the second semiconductor die facing the second RDL, wherein the third conductive features of the second semiconductor die are attached to the second conductive features of the second RDL, wherein the second RDL is disposed between the second semiconductor die and the first semiconductor die;

an interposer, wherein a first side of the interposer faces the second RDL and is electrically coupled to fourth conductive features on the first surface of the second RDL; and a third semiconductor die electrically coupled to a second side of the interposer opposing the first side of the interposer, wherein the second semiconductor die is disposed between the third semiconductor die and the second RDL.

16. The apparatus of claim 15, further comprising:
a connector electrically connecting the interposer and the second RDL; and
a second through via extending through the interposer and electrically coupling the third semiconductor die to the second RDL.

17. The apparatus of claim 16, wherein a height of the connector is larger than a height of the second semiconductor die.

18. The apparatus of claim 17, wherein a back side of the second semiconductor die is spaced apart from the first side of the interposer.

19. The apparatus of claim 15, wherein the through vias comprises a copper pillar and a copper seed layer.

20. The apparatus of claim 15, wherein the through via has a first height measured between the first end and the second end of the through via, the first height being substantially equal to a second height of the first semiconductor die measured between the front side and the back side of the first semiconductor die.

* * * * *